United States Patent [19]

Adachi et al.

[11] Patent Number: 5,279,917
[45] Date of Patent: Jan. 18, 1994

[54] LIGHT-SENSITIVE COMPOSITION COMPRISING A FLUORINE COPOLYMER SURFACTANT

[75] Inventors: Yutaka Adachi, Hino; Hideyuki Nakai, Fussa; Takeshi Tanaka, Hachioji, all of Japan

[73] Assignee: Konica Corporation, Tokyo, Japan

[21] Appl. No.: 878,395

[22] Filed: May 4, 1992

[30] Foreign Application Priority Data

May 9, 1991 [JP] Japan .................. 3-132287

[51] Int. Cl.$^5$ .................. G03F 7/016; G03F 7/023; G03F 7/027; G03C 1/77
[52] U.S. Cl. .................. 430/157; 430/165; 430/175; 430/176; 430/191; 430/192; 430/193; 430/278; 430/281; 430/283; 430/284; 430/288
[58] Field of Search .............. 430/175, 176, 192, 193, 430/191, 165, 157, 281, 288, 283, 284, 278

[56] References Cited

U.S. PATENT DOCUMENTS

| | | | |
|---|---|---|---|
| 2,690,966 | 10/1954 | Minsk et al. | 430/287 |
| 2,732,301 | 1/1956 | Robertson et al. | 430/287 |
| 2,752,372 | 6/1956 | Reichstein | 552/563 |
| 2,956,878 | 10/1960 | Michiels et al. | 430/281 |
| 3,030,208 | 4/1962 | Schellenberg et al. | 430/325 |
| 3,096,311 | 7/1963 | Merrill et al. | 525/61 |
| 3,173,787 | 3/1965 | Clement et al. | 430/271 |
| 3,453,237 | 7/1969 | Borden et al. | 430/285 |
| 3,660,097 | 5/1972 | Mainthia | 430/175 |
| 3,707,373 | 12/1972 | Martinson et al. | 430/294 |
| 3,751,257 | 8/1973 | Dahlman | 430/176 |
| 4,072,527 | 2/1978 | Fan | 430/273 |
| 4,123,276 | 10/1978 | Kita et al. | 430/176 |
| 4,822,713 | 4/1989 | Nishioka et al. | 430/175 |
| 4,845,008 | 7/1989 | Nishioka et al. | 430/165 |
| 4,877,712 | 10/1989 | Namiki et al. | 430/256 |
| 5,006,443 | 4/1991 | Müller et al. | 430/176 |

*Primary Examiner*—Charles L. Bowers, Jr.
*Assistant Examiner*—John S. Chu
*Attorney, Agent, or Firm*—Finnegan, Henderson, Farabow, Garrett & Dunner

[57] ABSTRACT

A light-sensitive composition comprises a light-sensitive compound, an alkali soluble resin and a fluorine-containing surfactant. The surfactant is a copolymer of a (poyoxyalkylene)acrylate or (polyoxyalkylene)methacrylate with an acrylate or methacrylate having a fluorine-containing aliphatic group. The copolymer has a weight average molecular weight of 1000 to 6000 and contains the acrylate or methacrylate in an amount of 10 to 25% by weight. The fluorine-containing aliphatic group has 6 to 20 carbon atoms and 30% or more by weight of fluorine atoms.

8 Claims, No Drawings ial applications: 5,279,917

LIGHT-SENSITIVE COMPOSITION COMPRISING A FLUORINE COPOLYMER SURFACTANT

FIELD OF THE INVENTION

The present invention relates to a light-sensitive composition containing a fluorine-containing surfactant, particularly to a light-sensitive composition which is improved not only in coatability but also in storage stability when made up into a light-sensitive coating solution and has an excellent image visibility on light exposure and a high solubility in solvents.

BACKGROUND OF THE INVENTION

In manufacturing a light-sensitive planographic printing plate, for example, a light-sensitive material is dissolved in a suitable solvent, then coated and dried on a support. And as a measure to improve the coatability, a fluorine-containing surfactant is added to a solution dissolving a light-sensitive composition. Japanese Pat. O.P.I. Pub. Nos. 40249/1982 and 178242/1987, for example, describe that a uniform coating thickness can be obtained, without unevenness in coating, by coating and drying a light-sensitive coating solution to which a fluorine-containing surfactant is added in advance.

Japanese Pat. O.P.I. Pub. Nos. 135004/1979, 170950/1987 and 226143/1987, for example, describe that use of a light-sensitive composition containing an acrylic polymer surfactant bearing a fluorine containing aliphatic fluorinealiphatic group gives a uniform coating thickness, or improves the coatability of a light-sensitive coating solution.

Though this technique gives a good coatability, it cannot provide a light-sensitive composition having an adequate storage stability, because the solvent-solubility of the light-sensitive composition is so poor that gelation occurs after coating, and in a heavy case, precipitates are formed in a light-sensitive coating solution.

In addition, though conventional fluorine-containing surfactants can improve the coatability, they have a disadvantage of lowering the image visibility on light exposure.

SUMMARY OF THE INVENTION

The present inventors have made an extensive study to solve the above problems and found that the object of the invention is achieved by specifying the number of carbon atoms in the fluorine-containing aliphatic group and the fluorine content of said group of the fluorine-containing surfactant.

Accordingly, the object of the present invention is to provide a light-sensitive composition improved not only in coatability but in storage stability of a light-sensitive coating solution and excellent in both image visibility on light exposure and solvent solubility.

The object of the invention is attained by a light-sensitive composition comprising a light-sensitive compound, an alkali soluble resin and 0.1 to 1.0 wt % of a fluorine-containing surfactant which is a copolymer of a (polyoxyalkylene)acrylate or (polyoxyalkylene)methacrylate with an acrylate or methacrylate having a fluorine-containing aliphatic group, said copolymer having a weight average molecular weight of 1000 to 6000 and containing said acrylate or methacrylate in an amount of 10 to 25 wt %, and said fluorine-containing aliphatic group having 6 to 20 carbon atoms and 30wt % or more of fluorine atoms, and a light-sensitive planographic printing plate comprising an aluminium support and provided thereon, a light-sensitive composition comprising a light-sensitive composition comprising a light-sensitive compound, an alkali soluble resin and 0.1 to 1.0 wt % of a fluorine-containing surfactant, which is a copolymer of a (polyoxyalkylene)acrylate or (polyoxyalkylene)methacrylate with an acrylate or methacrylate having a fluorine-containing aliphatic group, said copolymer having a weight average molecular weight of 1000 to 6000 and containing said acrylate or methacrylate in an amount of 10 to 25 wt %, and said fluorine-containing aliphatic group having 6 to 20 carbon atoms and 30 wt % or more of fluorine atoms.

DETAILED DESCRIPTION OF THE INVENTION

The present invention is hereunder described in detail.

The invention provides a light-sensitive composition improved not only in coatability but also in storage stability when made up into a light-sensitive coating solution and having an excellent image visibility on light exposure and a high solvent solubility, by use of a fluorine-containing surfactant which meets the above requirements.

The fluorine-containing surfactant used in the invention is a copolymer of 1) and 2) described below, which has a weight average molecular weight of 1000 to 6000 and contains 1) in an amount of 10 to 25 wt %. 1) used here is an acrylate or methacrylate containing a fluorine-containing aliphatic group having 6 to 20 carbon atoms and a fluorine content of 30 wt % or more, and 2) is a (polyoxyalkylene)acrylate or a (polyoxyalkylene) methacrylate.

1) and 2) are hereunder described in detail.

The fluorine-containing aliphatic group contained in 1) is preferably one having a high fluorination degree as much as possible, and a fully fluorinated aliphatic group represented by $-C_nF_{2n+1}$ (n is an integer of 6 to 20) is especially preferred. When the fluorine content is less than 30 wt %, the coatability is not improved at all or to a satisfactory level. Further, when the number of carbon atoms is 5 or less, a good coatability cannot be obtained even if the alkyl group is fully fluorinated; when the number of carbon atoms is 21 or more, the solubility in solvents becomes poor and thereby precipitates are formed in a light-sensitive coating solution in the course of prolonged standing. Accordingly, the number of carbon atoms is preferably 8 to 14.

The copolymer may be formed from a mixture of monomers having respective fluorine-containing aliphatic groups different in number of carbon atoms. In this case, it is also necessary that the number of carbon atoms in a fluorine-containing aliphatic group contained in the structural unit represented by 1) be 6 to 20. Preferably, the copolymer is comprised only of monomers having 8 to 14 carbon atoms.

It is preferable that the fluorine-containing aliphatic group be linked to the principal chain of the copolymer via an ester or amido bond. Accordingly, when the fluorine-containing aliphatic group is denoted by Rf, preferable examples of the structure expressed by 1) can be represented as follows:

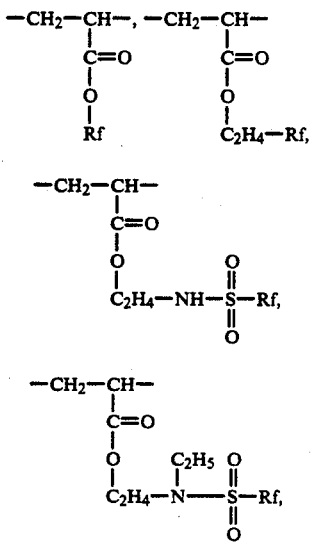

The above examples are for the acrylate, and methacrylates respectively corresponding to the above structures can also be used favorably.

The carbon number of the alkylene group in the polyoxyalkylene group contained in 2) to be copolymerized with 1) is preferably 2 or 3, and a mixture of polyoxyalkylene groups different in the carbon number of the alkylene group can also be used.

When the content of 1) in the copolymer is lower than 10 wt %, the coatability cannot be improved enough. On the contrary, a content higher than 25 wt % lowers the image visibility on light exposure.

Further, when the weight average molecular weight of the copolymer is less than 1000, the coatability cannot be improved enough; when it is more than 6000, the storage stability of a light-sensitive coating solution is deteriorated.

The fluorine-containing surfactant of the invention is used in an amount of 0.1 to 1.0 wt %, preferably 0.2 to 0.5 wt % of the solid matter contained in a light-sensitive composition. The fluorine-containing serfactant is contained in the composition of the invention in an amount of 0.1 to 1.0%, preferably 0.2 to 0.5 wt %.

The light-sensitive composition of the invention includes both negative-type and positive-type light-sensitive compositions. As the positive-type light-sensitive composition, a polymer containing o-quinonediazide group is mainly employed. The polymer containing an o-quinonediazide group used here means a condensation product of an o-quinonediazide-group-containing compound and an alkali-soluble resin or a condensation product of an o-quinonediazide-group-containing compound and an alkali-soluble resin or a condensation product of an o-quinonediazide group-containing-compound and a compound containing a phenolic hydroxy group.

Typical examples thereof are described below.

The polymer containing an o-quinonediazide group includes, for example, an esterified compound obtained from o-naphthoquinonediazide sulfonic acid and a polycondensation resin between a phenolic compound and an aldehyde or ketone.

The above phenolic compound includes, for example, monovalent phenols such as phenol, o-cresol, m-cresol, p-cresol, 3,5-xylenol, carvacrol, thymol; divalent phenols such as catechol, resorcinol, hydroquinone; and trivalent phenols such as pyrogallol, phloroglucinol.

Examples of the above aldehyde include formaldehyde, benzaldehyde, acetaldehyde, crotonaldehyde and furfural. Among these aldehydes, formaldehyde and benzaldehyde are preferred.

Examples of the above ketone include acetone and methyl ethyl ketone.

Typical examples of the above polycondensation resin include phenol-formaldehyde resin, m-cresol-formaldehyde resin, meta and para mixed cresol-formaldehyde resin, resorcinol-benzaldehyde resin and pyrogallol-acetone resin.

The condensation ratio of o-naphthoquinonediazide sulfonic acid to a phenolic compound in the above o-naphthoquinonediazide compound (the reaction ratio per OH group) is 15 to 80%, preferably 20 to 45%.

In addition, as an o-quinonediazide compound usable in the invention, those described in Japanese Pat. O.P.I. Pub. No. 43451/1983 can also be included.

Of the above o-quinonediazide compounds, particularly preferred one is an o-quinonediazide ester compound obtained by allowing 1,2-benzoquinonediazide sulfonyl chloride or 1,2-naphthoquinonediazide sulfonyl chloride to react with a pyrogallol-acetone resin or 2,3,4-trihydroxybenzophenone.

In the invention, these o-quinonediazide compounds may be used singly or in combination.

The weight average molecular weight of the polymer containing an o-quinonediazide group high molecular compound used in the invention is preferably 1500 or more, especially 2000 or more in view of the coatability.

Preferably, the above o-quinonediazide compound is used in combination with an alkali-soluble resin. Usable alkali-soluble resins include novolak resins; vinyl polymers having a phenolic hydroxyl group; and condensation resins between a polyvalent phenol and an aldehyde or ketone, which are disclosed in Japanese Pat. O.P.I. Pub. No. 57841/1980. Examples of the novolak resin include phenol-formaldehyde resins; cresol-formaldehyde resins; phenol-cresol-fromaldehyde copolycondensation resins such as ones disclosed in Japanese Pat. O.P.I. Pub. No. 57841/1980; and copolycondensation resins of a p-substituted phenol, phenol or cresol with formaldehyde, such as ones disclosed in Japanese Pat. O.P.I. Pub. No. 127553/1980.

The vinyl polymer having a phenolic hydroxyl group is a polymer which contains, in the molecular structure, a unit having a phenolic hydroxyl group. Such a polymer preferably contains at least one of the structural units represented by the following formulas [1] to [5].

 Formula [1]

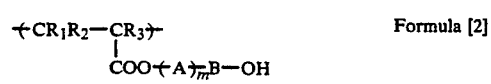 Formula [2]

 Formula [3]

-continued

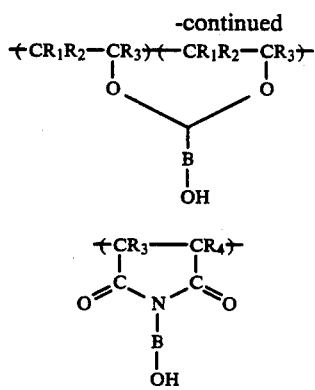

Formula [4]

Formula [5]

In the formulas, $R_1$ and $R_2$ each represent a hydrogen atom, an alkyl or a carboxyl group, preferably a hydrogen atom; $R_3$ represents a hydrogen or halogen atom or an alkyl group, preferably a hydrogen atom or an alkyl group such as a methyl or ethyl group; $R_4$ represents a hydrogen atom or an alkyl, aryl or aralkyl group, preferably a hydrogen atom. A represents a alkylene group which links a nitrogen or oxygen with an aromatic carbon atom and may have a substituent; m represents an integer of 0 to 10; and B represents a phenylene or naphthylene group, which may have a substituent.

The polymer used in the light-sensitive composition of the invention is preferably one having a copolymer structure. And the monomer used to copolymerize with the structural units represented by the above formulas [1] to [5] includes, for example, ethylene type unsaturated olefines such as ethylene, propylene, isobutylene, butadien, isoprene; styrene and its anologues such as styrene, α-methyl styrene, p-methyl styrene, p-chlorostyrene; acrylic and its anologues acids such as acrylic acid, methacrylic acid; unsaturated aliphatic dicarboxylic acids such as itaconic acid, maleic acid, maleic anhydride; α-methylene aliphatic monocarboxylates such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate; nitriles such as acrylonitrile, methacrylonitrile; amides such as acrylamide; anilides such as acrylanilide, p-chloroacrylamide, m-nitroacrylanilide, m-methoxyacrylanilide; vinyl esters such as vinyl acetate, vinyl propionate, vinyl benzoate; vinyl ethers such as methyl vinyl ether, ethyl vinyl ether, isobutyl vinyl ether, β-chloroethyl vinyl ether; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene, 1-methyl-1-nitroethylene; and vinyl-type monomers such as N-vinylpyrrole, N-vinylcarbazole, N-vinylindole, N-vinylpyrrolidine, N-vinylpyrrolidone. These vinyl-type monomers are present in the high molecular compound in the form of cleaved unsaturated double bond.

Among the above monomers, the aliphatic monocarboxylates and nitriles are preferred for their high performance in achieving the object of the invention.

The molecular weight of these alkali-soluble resins is preferably not less than 1500, especially not less than 2000, in view of the coatability.

Besides the above basic materials, these light-sensitive compositions may contain, when necessary, colorants such as dyes and pigment, a lipophilic compound, plasticizers, surfactants, organic acids, acid anhydrides and compounds capable of forming an acid upon exposure.

The negative type light-sensitive material used in the invention greatly varies in types. Among them, typical ones are described hereunder.

(1) light-sensitive composition containing a diazo resin

The diazo resin represented by condensation products of p-diazodiphenylamine and formaldehyde may be either water-soluble or water-insoluble. But water-insoluble and organic-solvent-soluble ones, such as those disclosed in Japanese Pat. Exam. Pub. Nos. 1167/1972 and 43890/1982, are favorably used. Particularly preferred diazo resins are those represented by the following formula [6].

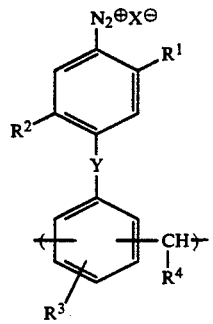

Formula [6]

In the formula, $R^1$, $R^2$ and $R^3$ each represent a hydrogen atom, or an alkyl or alkoxy group; R4 represents a hydrogen atom, or an alkyl or phenyl group; X represents $PF_6$ or $BF_4$; and Y represents -NH-, -S- or -O-.

It is preferable that the diazo resin be used in combination with a film-forming resin, particularly with a lipophilic high molecular compound having a hydroxyl group. Examples of such a lipophilic high molecular compound include, besides those shown above, copolymers between a monomer having an aliphatic hydroxyl group as side chain such as 2-hydroxyethyl acrylate or 2-hydroxyethyl methacrylate and another copolymerizable monomer. In addition to the above, there may be added polyvinyl butyral resins, polyurethane resins, polyamide resins, epoxy resins, novolak resins or natural resins according to a specific requirement.

As the resin used together with a diazonium salt, various high molecular compounds are available. Of these resins, preferred ones are alkali soluble resins such as copolymers between a monomer having an aromatic hydroxyl group such as N-(4-hydroxyphenyl)acrylamide, N-(4-hydroxyphenyl)methacrylamide, o-, m- or p-hydroxystyrene or o-, m- or p-hydroxyphenyl methacrylate and another monomer, such as those seen in Japanese Pat. O.P.I. Pub. No. 98613/1979; polymers containing hydroxyethyl acrylate units or hydroxyethyl methacrylate units as the repetitive unit, such as those seen in U.S. Pat. No. 4,123,276; natural resins such as shellac and rosin; polyvinyl alcohols; polyamide resins disclosed in U.S. Pat. No. 3,751,257; linear polyurethane resins disclosed in U.S. Pat. No. 3,660,097; phthalated polyvinyl alcohol resins; epoxy resins obtained from bisphenol A and epichlorohydrin; and cellulosic resins such as cellulose acetate and cellulose acetate phthalate.

As the alkali-soluble resins, there can be employed novolak resins, vinyl polymers having a phenolic hydroxyl group, and condensation resins between a polyvalent phenol and an aldehyde or ketone disclosed in Japanese Pat. O.P.I. Pub. No. 57841/1980. Examples of the novolak resin include phenol-formaldehyde resins, cresol-formaldehyde resins, phenol-cresol-formaldehyde copolycondensation resins as are disclosed in Japanese Pat. O.P.I. Pub. No. 57841/1980, and copolycondensation resins between a p-substituted phenol, phenol or cresol and formaldehyde, as are disclosed in Japanese Pat. O.P.I. Pub. No. 127553/1980.

These resins are used in an amount of 40 to 99 wt %, preferably 50 to 95 wt% of the solid matter of the light-sensitive composition. And the diazo resin is used in an amount of 1 to 60 wt %, preferably 3 to 30 wt %.

If necessary, these light-sensitive compositions may contain colorants such as dyes and pigments, a lipophilic compound, plasticizers, surfactants, organic acids, acid anhydrides, and compounds capable of releasing an acid upon exposure, in addition to the above basic materials.

(2) Light-sensitive composition containing a high molecular compound having a $-CH=CH-CO-$ group in the principal chain or a side chain of the polymer Examples of such high molecular compounds include one whose principal constituent is a light-sensitive polymer such as polyester, polyamide or polycarbonate having $-CH=CH-CO-$ as a photopolymerizable group in the principal chain or a side chain of the polymer (for example, the compounds disclosed in U.S. Pat. Nos. 3,030,208, 3,707,373 and 3,453,237); one whose principal constituent is a photo-curable polyester derived from a 2-propylidene malonic acid compound such as cinnamylidene malonic acid and a bifunctional glycol (for example, the photo-curable polymers disclosed in U.S. Pat. Nos. 2,956,878 and 3,173,787); and a cinnamate of a hydroxyl-group-containing polymer such as polyvinyl alcohol, starch, cellulose or analogue thereof (for example, the polymers disclosed in U.S. Pat. Nos. 2,690,966, 2,752,372 and 2,732,301).

These light-sensitive compositions may contain other sensitizers, stabilizers, plasticizers, pigments and dyes.

(13) Photopolymerizable composition comprised of an addition-polymerizable unsaturated compound This composition is preferably composed of (a) a monomer having at least two terminal vinyl groups, (b) a photopolymerization initiator, and (c) a high molecular compound which acts as a binder.

Vinyl monomers suitable for component (a) can be seen in Japanese Pat. Exam. Pub. Nos. 5093/1960, 14719/1960 and 8727/1969. Typical examples thereof include acrylates and methacrylates of polyols such as diethylene glycol (meth)acrylate, triethylene glycol di(meth)acrylate, pentaerythritol (meth)acrylate, trimethylolpropane (meth)acrylate; bis(meth)acrylamides such as methylenebis(meth)acrylamide, ethylenebis(meth)acrylamide; and urethane-group-containing unsaturated monomers such as reaction products of a diol mono(meth)acrylate and a diisocyanate, including di-(2'-methacryloxyethyl)2,4-tolylenediurethane and di-(2-acryloxyethyl)trimethylene diurethane.

As the photopolymerization initiator of component (b), the compounds represented by Formula [6]can be used, and other kinds of compounds may also be used.

There may be used, for example, those carbonyl compounds, organic sulfur compounds, peroxides, redox type compounds, azo and diazo compounds, halides and photoreductive pigments which are described in Chapter 5 of the foregoing Light Sensitive Systems written by J. Kosar. British Pat. No. 1,459,563 also discloses these materials.

Typical examples of such photopolymerization initiators include benzoin derivatives such as benzoin methyl ether, benzoin isopropyl ether, α,α-dimethoxy-α-phenylacetophenone; benzophenone derivatives such as benzophenone, 2,4-dichlorobenzophenone, methyl o-benzoylbenzoate, 4,4'-bis(dimethylamino)benzophenone, 4,4'-bis(diethylamino)benzophenone; thioxanthone derivatives such as 2-chlorothioxanthone, 2-isopropylthioxanthone; anthraquinone derivatives such as 2-chloroanthraquinone, 2-methylanthraquinone; acridone derivatives such as N-methylacridone, N-butylacridone; and α,α-diethoxyacetophenone, benzil, fluorenone, xanthone, uranyl compound and halides.

As the binder of component (c), various conventional polymers can be employed. Typical examples of such binders can be seen in U.S. Pat. No. 4,072,527.

Besides those binders, binders for the combined use with the above diazonium salts can also be employed.

These photopolymerizable compositions may contain thermopolymerization inhibitors, plasticizers, dyes and pigments.

(4) Light-sensitive composition containing an azido group

As the light-sensitive azido compound, there can be favorably used an aromatic azido compound in which the azido group is linked with the aromatic ring directly or via a carbonyl group or a sulfonyl group.

Examples of such azido compounds include polyazidostyrenes, polyvinyl-p-azidobenzoates and polyvinyl-p-azidobenzals, such as ones disclosed in U.S. Pat. No. 3,096,311; the reaction products of azidoaryl sulfonyl chloride and an unsaturated hydrocarbon polymer disclosed in Japanese Pat. Exam. Pub. No. 9613/1970; and polymers containing a sulfonylazido or carbonylazido group, like ones disclosed in Japanese Pat. Exam. Pub. Nos. 21017/1968, 229/1969, 22954/1969 and 24915/1970.

The additives to the above light-sensitive composition, such as a lipophilic compound, surfactants, sensitizers, stabilizers, thermopolymerization inhibitors, plasticizers, dyes and pigments, are used usually, though depending upon their types, in an amount of 0.01 to 20 wt %, preferably 0.05 to 10 wt % of the light-sensitive composition contained in a light-sensitive coating solution.

In the invention, various compounds can be used as a a lipophilic compound. Among them, preferred one are a resin obtained by condensation of a substituted phenol represented by the following formula [7] with an aldehyde, and an o-naphthoquinonediazide sulfonate of said resin.

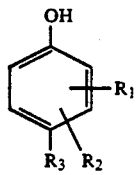

Formula [7]

In the formula, $R_1$ and $R_2$ each represent a hydrogen or halogen atom or an alkyl group, $R_3$ represents an alkyl or cycloalkyl group having 2 or more carbon atoms.

The alkyl group represented by $R_1$ or $R_2$ of Formula [7] is one having 1 to 3 carbon atoms, and an alkyl group having 1 or 2 carbon atoms is preferred. As the alkyl or cycloalkyl group represented by $R_3$, one having 15 or less carbon atoms is preferred, and one having 3 to 8 carbon atoms is particularly preferred.

The substituted phenol represented by Formula [7] includes, for example, isopropyl phenol, t-butyl phenol, t-amyl phenol, hexyl phenol, octyl phenol, cyclohexyl phenol, 3-methyl-4-chloro-5-t-butyl phenol, isopropyl cresol, t-butyl cresol, t-amyl cresol, hexyl cresol, octyl cresol, cyclooctyl cresol. Of them, octyl phenol and t-butyl phenol are particularly preferred.

The above aldehyde includes, for example, aliphatic and aromatic aldehydes such as formaldehyde, benzaldehyde, acetaldehyde, acrolein, crotonaldehyde and fulfural. Among these aldehydes, those which have 1 to 7 carbon atoms are preferred, and formaldehyde and benzaldehyde are particularly preferred.

The condensation resin between the substituted phenol and the aldehyde used in the invention can be prepared by polycondensation of these materials in the presence of an acid catalyst. And the o-naphthoquinonediazide sulfonate of this condensation resin can be obtained by esterification which comprises the steps of dissolving the condensation resin in a suitable solvent, pouring o-naphthoquinonediadize sulfonic chloride thereto, and adding an alkali dropwise to the equivalence point while stirring the mixture.

The dye used in the invention is preferably a basic dye or oil-soluble dye. Typical examples thereof includes basic dyes such as Victoria Pure Blue BOH, Victoria Blue BH, Methyl Violet, Eizen Malachite Green (made by Hodogaya Chemical Co.), Patent Pure Blue VX, Rhodamine B, Methylene Blue (made by Sumitomo Chemical Co.) and oil-soluble dyes such as Sudan Blue II, Victoria Blue F4R (made by BASF), Oil Blue #603, Oil Blue BOS, Oil Blue IIN (Orient Chemical Ind.).

A positive type light-sensitive planographic printing plate can be formed by dissolving the light-sensitive composition of the invention in a solvent capable of dissolving the above components, then coating and drying the solution on a suitable support. Examples of the usable solvent include alcohols such as methanol, ethanol, isopropanol, n-propanol, n-butanol, isobutanol, t-butanol, 1-pentanol, 2-pentanol, 1-hexanol; ketones such as acetone, methyl ethyl ketone, methyl n-propyl ketone, ethyl isopropyl ketone, methyl n-butyl ketone, methyl isobutyl ketone, cyclopentanone, cyclohexanone; ethylene glycol derivatives such as ethylene glycol monomethyl ether, ethylene glycol monoethyl ether, ethylene glycol n-butyl ether, ethylene glycol monomethyl ether acetate, ethylene glycol monoethyl ether acetate, ethylene glycol isopropyl ether acetate; diethylene glycol derivatives such as diethylene glycol monomethyl ether, diethylene glycol monoethyl ether, diethylene glycol isopropyl ether, diethylene glycol phenyl ether, diethylene glycol dimethyl ether, diethylene glycol diethyl ether, diethylene glycol monomethyl ether acetate, propylene glycol derivatives such as propylene glycol monomethyl ether, propylene glycol monomethyl ether acetate, propylene glycol monoethyl ether, propylene glycol isopropyl ether; acetates such as ethyl acetate, n-propyl acetate, isopropyl acetate, butyl acetate; and other solvents such as methyl lactate, ethyl lactate, diethyl ether, dioxane, dimethyl formamide, dimethyl sulfoxide, γ-butyrolactone, 3-methoxy-1-butanol, 3-methyl-3-methoxy-1-butanol, tetrahydrofuran, methylene chloride.

As the support on which the light-sensitive coating solution of the invention is coated to make a light-sensitive printing plate, various materials can be employed. Examples thereof include plates of a metal such as aluminium, zinc, copper or steel; metal plates on which a metal, such as chromium, zinc, copper, nickel or aluminium, is plated or deposited; paper or plastics subjected to a treatment for giving hydrophilicity; paper or plastic film on which metal is deposited; glass plates; paper coated with a resin; and paper laminated with foil of a metal such as aluminium. Of them, an aluminium plate is preferred.

When an aluminium plate is used as the support, it is preferable that surface treatments, such as roughening and anodizing, and sealing if necessary, be performed.

This roughening can be carried out by subjecting a degreased aluminum plate to brush polishing, ball polishing, chemical polishing or electrolytic etching.

The anodizing is performed by applying an electric current, with an aluminium plate acting as the anode, in an aqueous or non-aqueous solution containing one or combination of inorganic salts such as phosphates, chromates, borates, sulfates, and oxalic acid and sulfamic acid.

The sealing is carried out by dipping an aluminium plate in an aqueous solution of sodium silicate, hot water, or a hot aqueous solution dissolving a small amount of an inorganic or organic salt, or by subjecting it to steaming.

In the invention, the coating weight of a light-sensitive coating solution on a support, though varies by uses, is generally 0.5 to 3.5 g/m$^2$ as solid matter.

Coating of a coating solution of the invention can be carried out by any of dip coating, roll coating, reverse coating, air doctor coating, blade coating, rod coating, knife coating, squeeze coating, gravure coating, cast coating, curtain coating and extrusion coating. The coating thickness is preferably 0.1 to 5 g/m$^2$. The drying temperature is 20 to 150° C., preferably 30 to 100° C.

EXAMPLES

The invention is hereunder described with examples, but the scope of the invention is not limited to them.

EXAMPLE 1

A light-sensitive coating solution having the following composition was prepared. It was then coated on a roughened aluminum plate with a roll coater so as to give a dry coating weight of 2.2 g/m$^2$, followed by drying. This procedure was repeated while changing the fluorine-containing surfactant as shown in Table 1 to obtain samples of light-sensitive planographic printing plate.

| Light-sensitive coating solution | |
|---|---|
| Ester of pyrogallol-acetone resin and naphthoquinone-(1,2)-diazide-5-sulfonic chloride (weight average molecular weight: 2500) | 2.3 parts by weight |
| Copolycondennsate of phenol and meta/para mixed cresol (molar ratio was 48:32:20) with formaldehyde (average molecular weight: 8000) | 6.7 parts by weight |
| 2-Trichloromethyl-5-(β-benzofurylvinyl)-1,3,4-oxaziazole | 0.05 part by weight |
| Victoria Pure Blue BOH | 0.07 part by weight |
| Fluorine-containing surfactant (shown in Table 1) | 0.02 part by weight |
| Ethylene glycol monomethyl ether | 45.0 parts by weight |

The evaluation of coatability and image visibility on light exposure of these light-sensitive planographic printing plate samples gave the results shown in Table 1. The evaluation method of the image visibility on light exposure was as follows:

After each sample was exposed by use of idorfin 2000 made by Iwasaki Electric Co., the reflection density of the exposed sample was measured through a red filter using Sakura Densitometer made by Konica Corp. Then, the difference ($\Delta D$) between the exposed portion and the unexposed portion was calculated.

Separately, each of the above light-sensitive coating solutions was preserved for 7 days at 30° C. in an airtight container. Then, it was checked if there was any precipitate, and the image visibility on light exposure was also evaluated in the same manner as with the sample which was not preserved. The results were also shown in Table 1.

Rating

Coatability

A: Uneven coating was not observed.
B: Uneven coating was slightly observed.
C: Uneven coating occurred heavily.
A: No precipitation occurred.
B: Precipitates were observed on a filter paper when the solution was filtered (visually, precipitates were not observed in the solution).
C: Clear precipitates were visually observed.

The fluorine-containing surfactants used were the copolymers obtained by polymerizing the following monomers at the respective composition ratios (weight %) shown in Tables 1 and 2.

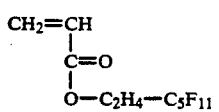

A.

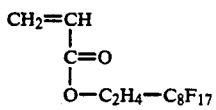

B.

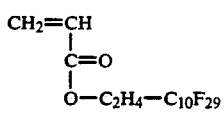

C.

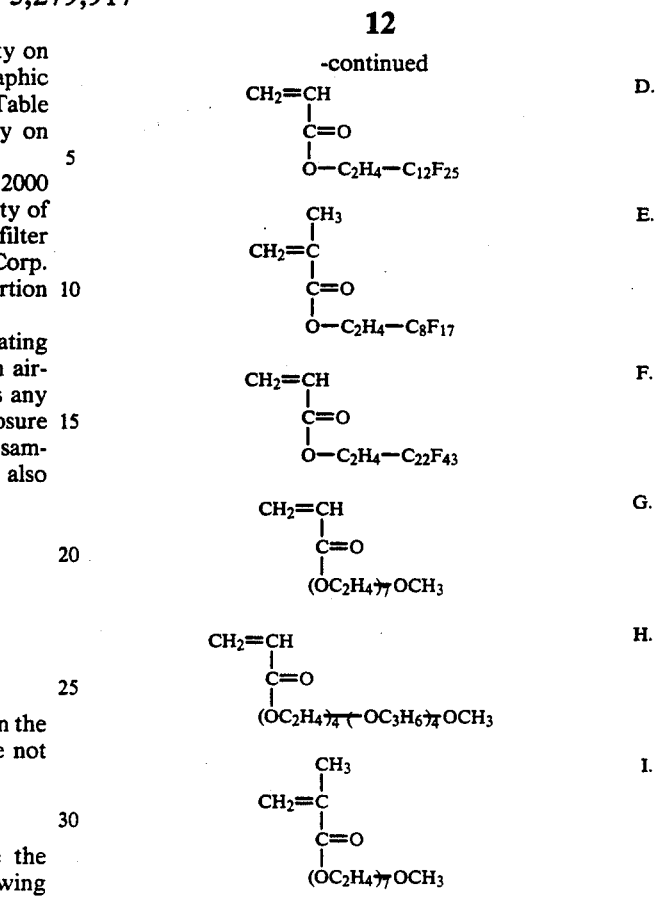

TABLE 1

| Sample No. | Monomer ratio (wt %) of copolymer (surfactant) | | | | | | | | | Weight average molecular weight | Rating | | | |
|---|---|---|---|---|---|---|---|---|---|---|---|---|---|---|
| | | | | | | | | | | | Not preserved | | After preservation | |
| | A | B | C | D | E | F | G | H | I | | coatability | image visibility on light exposure ($\Delta D$) | Precipitation | image visibility on light exposure ($\Delta D$) |
| Invention 1 | 20 | | | | | | 40 | | 40 | 4000 | A | 0.25 | A | 0.21 |
| Invention 2 | 10 | | | | | | 20 | 30 | 40 | 6000 | A | 0.25 | A | 0.21 |
| Invention 3 | 20 | 3 | | | | | 17 | 33 | 27 | 5500 | A | 0.25 | A | 0.20 |
| Invention 4 | 20 | | | | | | 40 | | 40 | 1500 | A | 0.25 | A | 0.21 |
| Invention 5 | 12 | 5 | 2 | 1 | | | | | 80 | 4000 | A | 0.25 | A | 0.21 |
| Non-invention 6 | 20 | | | | | | 40 | | 40 | 12000 | A | 0.24 | C | 0.18 |
| Non-invention 7 | 5 | | | | | | 15 | 30 | 50 | 4000 | B | 0.25 | A | 0.20 |
| Non-invention 8 | 40 | | | | | | 30 | | 30 | 4000 | A | 0.21 | A | 0.15 |
| Non-invention 9 | | | | | | 20 | 40 | | 40 | 4000 | A | 0.24 | C | 0.17 |
| Non-invention 10 | Not added | | | | | | | | | | C | 0.26 | A | 0.22 |

EXAMPLE 2

A light-sensitive coating solution having the following composition was prepared. Then, it was coated on a roughened aluminum plate with a roll coater so as to give a dry coating weight of 1.6 g/m², followed by drying. This procedure was repeated while changing the fluorine-containing surfactant as shown in Table 2 to obtain light-sensitive planographic printing plate samples.

| Light-sensitive coating solution | |
|---|---|
| Copolymer obtained from a mixture of N-(4-hydroxyphenyl) methacrylic acid/acrylonitrile/ethyl acrylate/methacrylic acid/n-butyl acrylate (monomer ratio was 8/32/40/10/10) according to synthesis example 1 of Japanese Pat. O.P.I. Pub. No. 7045/1987 (Mw = | 6.0 parts by weight |

-continued

| Light-sensitive coating solution | |
|---|---|
| 55000) | |
| Hexafluorophosphate of a resin obtained by condensation between p-diazodiphenylamine and formaldehyde (molar ratio was 1:0.9) (Mw = 2400) | 0.48 part by weight |
| AC-10L made by Nippon Junyaku Co. | 0.36 part by weight |
| Victoria Pure Blue BOH | 0.09 part by weight |
| Fluorine-containing surfactant (shown in Table 2) | 0.02 part by weight |
| Ethylene glycol monomethyl ether | 45.0 parts by weight |

The coatability and image visibility on light exposure of these light-sensitive planographic printing plate samples are shown in Table 2, together with the observation results of precipitation in the light-sensitive coating solutions preserved in airtight containers for 7 days at 30° C. as well as the image visibility on light exposure of the samples prepared from such preserved solutions. The evaluation methods and rating criteria used were the same as those in Example 1.

TABLE 1

| | Monomer ratio (wt %) of copolymer (surfactant) | | | | | | | | | Weight average molecular weight | Rating | | | |
|---|---|---|---|---|---|---|---|---|---|---|---|---|---|---|
| | | | | | | | | | | | Not preserved | | After preservation | |
| Sample No. | A | B | C | D | E | F | G | H | I | | coatability | image visibility on light exposure (ΔD) | Precipitation | image visibility on light exposure (ΔD) |
| Invention 11 | 20 | | | | | 40 | | 40 | | 4000 | A | 0.34 | A | 0.27 |
| Invention 12 | 10 | | | | | | 20 | 30 | 40 | 6000 | A | 0.33 | A | 0.27 |
| Invention 13 | 20 | 3 | | | | | 17 | 33 | 27 | 5500 | A | 0.34 | A | 0.28 |
| Invention 14 | 20 | | | | | 40 | | 40 | | 1500 | A | 0.34 | A | 0.27 |
| Invention 15 | 12 | 5 | 2 | 1 | | | | | 80 | 4000 | A | 0.33 | A | 0.28 |
| Non-invention 16 | 20 | | | | | 40 | | 40 | | 12000 | A | 0.31 | C | 0.20 |
| Non-invention 17 | 5 | | | | | | 15 | 30 | 50 | 4000 | B | 0.33 | A | 0.25 |
| Non-invention 18 | 40 | | | | | | 30 | | 30 | 4000 | A | 0.30 | A | 0.16 |
| Non-invention 19 | | | | | 20 | 40 | | 40 | | 4000 | A | 0.33 | C | 0.20 |
| Non-invention 20 | | | | | Not added | | | | | | C | 0.34 | A | 0.28 |

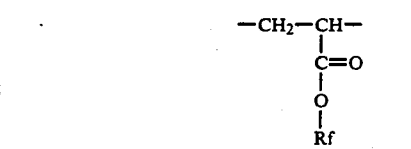

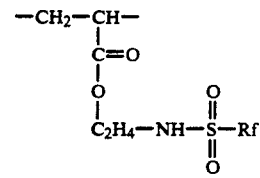

What is claimed is:

1. A light-sensitive planographic printing plate comprising an aluminium support and provided thereon, a light-sensitive composition comprising in admixture a light-sensitive compound, an akali soluble resin and 0.1 to 1.0 % by weight of a fluorine-containing surfactant, wherein the surfactant is a copolymer of a (polyoxyalkylene)acrylate or (polyoxyakylene)methacrylate with an acrylate or methacrylate having a fluorine-containing aliphatic group, said copolymer having a weight average molecular weight of 1000 to 6000 and containing, said acrylate or methacrylate in an amount of 10 to 23 % by weight, said fluorine-containing aliphatic group having 6 to 20 carbon atoms and 30 % or more by weight of fluorine atoms.

2. The printing plate of claim 1, wherein said fluorine-containing aliphatic group is a group represented by $-C_nF_{2n+1}$ wherein n represents an integer of 6 to 20.

3. The printing plate of claim 1, wherein said fluorine-containing aliphatic group is a group represented by $-C_nF_{2n+1}$ wherein n represents an integer of 8 to 14.

4. The printing plate of claim 1, wherein said fluorine-containing surfactant has a unit represented by the following formula;

$$-CH_2-CH- \atop | \atop C=O \atop | \atop O \atop | \atop Rf$$

$$-CH_2-CH- \atop | \atop C=O \atop | \atop O \atop | \atop C_2H_4-Rf$$

$$-CH_2-CH- \atop | \atop C=O \atop | \atop O \atop | \atop C_2H_4-NH-S(O)_2-Rf$$

$$-CH_2-CH- \atop | \atop C=O \atop | \atop O \atop | \atop C_2H_4-N(C_2H_5)-S(O)_2-Rf$$

wherein Rf represents a fluorine-containing aliphatic group having 6 to 20 carbon atoms.

5. The printing plate of claim 1, wherein said acrylate having a fluorine-containing aliphatic group is a compound represented by the following formula;

$$CH_2=CH \atop | \atop C=O \atop | \atop O-C_2H_4-C_8F_{17}$$

6. The printing plate of claim 1, wherein the carbon number of the alkylene group in said (polyoxyalkylene)acrylate or (polyoxyalkylene)methacrylate is 2 or 3.

7. The printing plate of claim 1, wherein said light-sensitive compound includes a polymer containing a o-quinonediazide group.

8. The printing pate of claim 1, wherein said light-sensitive compound includes a diazo resin.

* * * * *